United States Patent
Park

(10) Patent No.: US 7,470,969 B2
(45) Date of Patent: Dec. 30, 2008

(54) SEMICONDUCTOR DEVICE AND FABRICATION METHOD THEREOF

(75) Inventor: Geon-Ook Park, Mapo-ku (KR)

(73) Assignee: Dongbu Electronics Co., Ltd., Seoul (KR)

( * ) Notice: Subject to any disclaimer, the term of this patent is extended or adjusted under 35 U.S.C. 154(b) by 292 days.

(21) Appl. No.: 11/187,162

(22) Filed: Jul. 22, 2005

(65) Prior Publication Data

US 2005/0269670 A1    Dec. 8, 2005

Related U.S. Application Data

(60) Continuation of application No. 10/817,096, filed on Apr. 2, 2004, now Pat. No. 7,122,440, which is a division of application No. 10/630,179, filed on Jul. 30, 2003, now Pat. No. 6,794,702.

(30) Foreign Application Priority Data

Jul. 30, 2002    (KR) ...................... 10-2002-0045023

(51) Int. Cl.
*H01L 21/425*    (2006.01)
(52) U.S. Cl. ...................... 257/532; 257/528
(58) Field of Classification Search .................. 257/528, 257/532
See application file for complete search history.

(56) References Cited

U.S. PATENT DOCUMENTS

| 6,088,070 | A  | * | 7/2000  | Ohtani et al. .................. 349/38 |
| 6,500,724 | B1 | * | 12/2002 | Zurcher et al. ............... 438/384 |
| 2002/0155676 | A1 | * | 10/2002 | Stetter et al. ................. 438/396 |
| 2003/0002238 | A1 | * | 1/2003  | Toyoda ........................ 361/302 |

* cited by examiner

*Primary Examiner*—Long Pham
(74) *Attorney, Agent, or Firm*—Andrew D. Fortney

(57) ABSTRACT

A semiconductor device and a fabrication method thereof in which the semiconductor device includes capacitors having a metal/insulator/metal (MIM) structure are disclosed. The method includes forming an interlayer insulating film on a structure of a semiconductor substrate that exposes lower wiring and a lower insulating film; selectively etching the interlayer insulating film to form a first electrode opening that exposes the lower wiring; forming a first electrode in the first electrode opening such that the first electrode opening is filled; selectively etching the interlayer insulating film at a region of the same adjacent to the first electrode to thereby form a second electrode opening; forming a dielectric layer along inner walls that define the second electrode opening; forming a second electrode on the dielectric layer in such a manner to fill the second electrode opening; and forming upper wiring on at least a portion of the second electrode.

14 Claims, 7 Drawing Sheets

SEMICONDUCTOR DEVICE AND FABRICATION METHOD THEREOF

RELATED APPLICATION

This patent application is a continuation of U.S. patent application Ser. No. 10/817,096, filed Apr. 2, 2004 now U.S. Pat. No. 7,122,440, which is a divisional of U.S. patent application Ser. No. 10/630,179, filed Jul. 30, 2003, now U.S. Pat. No. 6,794,702, which claims the benefit of the filing date of Korean Patent Application No. 10-2002-0045023, filed Jul. 30, 2002.

FIELD OF DISCLOSURE

The present disclosure relates to a semiconductor device and a fabrication method thereof, and more particularly, to a semiconductor device and a fabrication method thereof in which the semiconductor device includes capacitors having a metal/insulator/metal (MIM) structure.

BACKGROUND

In recent times, much research is being pursued in the area of semiconductor devices in order to realize high-capacity capacitors in analog circuits that require high-speed operation. Since conductive polysilicon is used for an upper electrode and a lower electrode in the case of a PIP structure, that is, a structure in which polysilicon, an insulator, and polysilicon are layered, an oxidation reaction occurs between contacting surfaces of a dielectric film and the upper and lower electrodes to form a natural oxidation film. The natural oxidation film reduces overall capacitance.

To remedy this problem, an MIS (metal/insulator/silicon) structure or an MIM (metal/insulator/metal) structure is used for the capacitor. The latter (i.e., the capacitor having the MIM structure) is more commonly used in semiconductor devices as a result of its low resistivity, and because such a capacitor has no internal parasitic capacitance, which is caused by depletion.

A method of fabricating a capacitor having the MIM structure according to a conventional semiconductor device manufacturing method is described herein with reference to the drawings. FIGS. 1A, 1B, and 1C, which are partial sectional views used to describe the formation of a capacitor having an MIM structure using a conventional method.

Referring first to FIG. 1A, a lower insulating film 2 is formed on a semiconductor substrate 1. The lower insulating film 2 is realized using conventional semiconductor device processes and formed of an oxidation film such as PSG (phospho-silicate glass). Next, a Ti barrier layer 3, Al lower wiring 4, a Ti glue layer 5, and a TiN reflection preventing film 6 are formed in this sequence on the lower insulating film 2. Also, an SiN dielectric layer 7, which acts as a capacitor, is formed on the TiN reflection preventing film 6.

Subsequently, a first photosensitive film pattern is formed on the SiN dielectric layer 7. The first photosensitive film pattern is used as a mask to selectively etch the SiN dielectric layer 7 to thereby form the SiN dielectric layer 7 to a predetermined width, after which the first photosensitive film pattern is removed and a cleaning process performed. An area of the SiN dielectric layer 7 is varied according to the desired capacitance value, and is typically approximately 10 μm by 10 μm.

Next, a second photosensitive film pattern, which has a greater width than the first photosensitive film pattern, is formed on the SiN dielectric layer 7 and the TiN reflection preventing film 6. The second photosensitive film pattern is used as a mask such that an exposed area of the TiN reflection preventing film 6, and predetermined areas of the Ti glue layer 5, the Al lower wiring 4, and the Ti barrier layer 3 under this exposed area of the TiN reflection preventing film 6 are etched. This results in the TiN reflection preventing film 6, the Ti glue layer 5, the Al lower wiring 4, and the Ti barrier layer 3 being left remaining at a predetermined width. The second photosensitive pattern is then removed and a cleaning process is performed.

Subsequently, with reference to FIG. 1B, an HDP (high density plasma) oxidation film 8 is formed using an HDP process to fill gaps between adjacent metal wiring, after which a TEOS film 9 is formed on the HDP oxidation film 8 using conventional plasma processes. A CMP (chemical mechanical polishing) process is then performed to flatten an upper surface of the TEOS film 9.

Next, a photosensitive film is deposited on the flattened upper surface of the TEOS film 9, then exposure and development are performed to form a third photosensitive film pattern that exposes predetermined areas of the upper surface of the TEOS film 9 (i.e., areas where via openings will be formed). The third photosensitive film pattern is then used as a mask to perform reactive ion etching of exposed portions of the TEOS film 9 and the HDP oxidation film 8 thereunder, thereby forming via openings 100 of a predetermined width that expose an upper surface of the SiN dielectric layer 7.

Next, with reference to FIG. 1C, following the removal of the third photosensitive film pattern and the performing of a cleaning process, a first barrier metal film 10 is formed along inner walls of the via opening 100. Tungsten 11 is then formed covering the first barrier metal film 10 and completely filling the via opening 100. Following this process, CMP is performed until the upper surface of the TEOS film 9 is exposed.

Subsequently, a Ti barrier film 12, Al upper wiring 13, a Ti glue layer 14, and a TiN reflection preventing film 15 are formed in this sequence on the flattened upper surface of the TEOS film 9 and the tungsten 11.

In the conventional method described above, aluminum is used as the wiring metal material to form the lower electrode, dielectric layer, and upper electrode of the capacitor on the lower wiring, then upper wiring is formed over these elements. The conventional capacitor therefore has a vertical structure.

However, the capacitance of the capacitor is dependent upon the contact area of the dielectric layer and the upper and lower electrodes or the thicknesses of these elements, and the areas of the upper substrate and the lower substrate must be at least as large as the contact area of the dielectric layer. Accordingly, in the case where the upper wiring, which is significantly more densely formed than the lower wiring, this condition acts to restrict the degree of integration that can be obtained.

Further, with the capacitor having such a vertical structure, because the dielectric layer is formed perpendicular to the etching direction, that is, to the direction of etching the via openings, a thickness of the dielectric layer may be altered in the process of etching. This may result in an abnormal capacitance value and ultimately cause the device to malfunction.

DETAILED DESCRIPTION

Tungsten (W), aluminum (Al), and aluminum alloys are metals widely used for metal wiring in a semiconductor device. Many are actively pursuing research into using copper (Cu) in place these other metals for the metal wiring of semiconductor devices since copper has a low resistivity and is more reliable than tungsten and aluminum.

However, unlike with tungsten and aluminum, it is difficult to form wiring by reactive ion etching using copper. Accordingly, when using copper, copper is blanket-formed on a wafer having formed thereon via openings, then excess copper on a surface of the wafer is removed through chemical mechanical polishing (CMP) to thereby form copper wiring using a damascene process.

In the examples described herein, such a damascene process is used to form wiring material and electrode material, and to form capacitors in a horizontal structure.

Figure 1A:
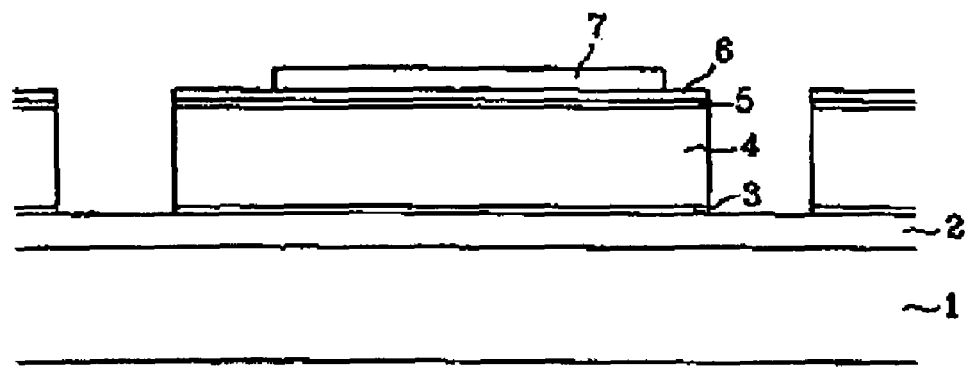
FIGS. 1A, 1B, and 1C are partial sectional views depicting the formation of a capacitor using a conventional method.
Figure 1B:
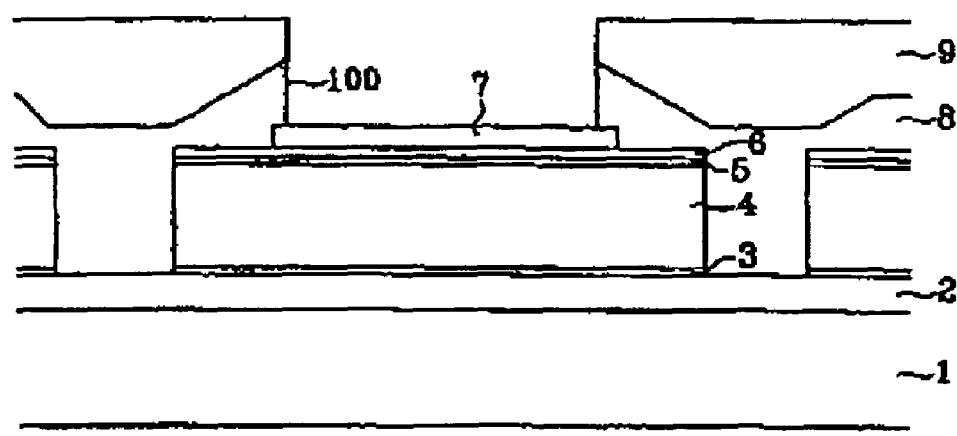
Figure 1C:
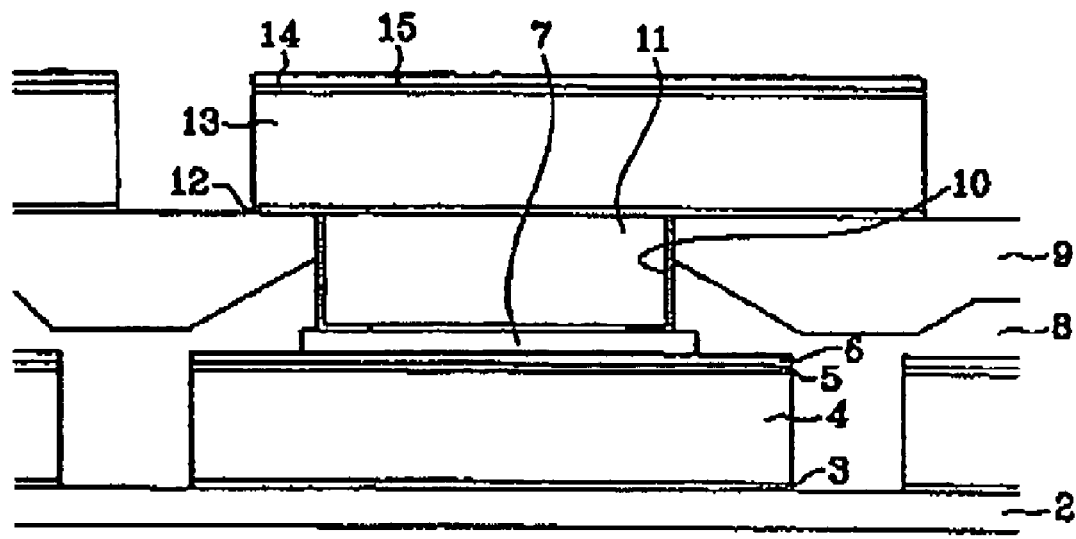
Figure 2A:
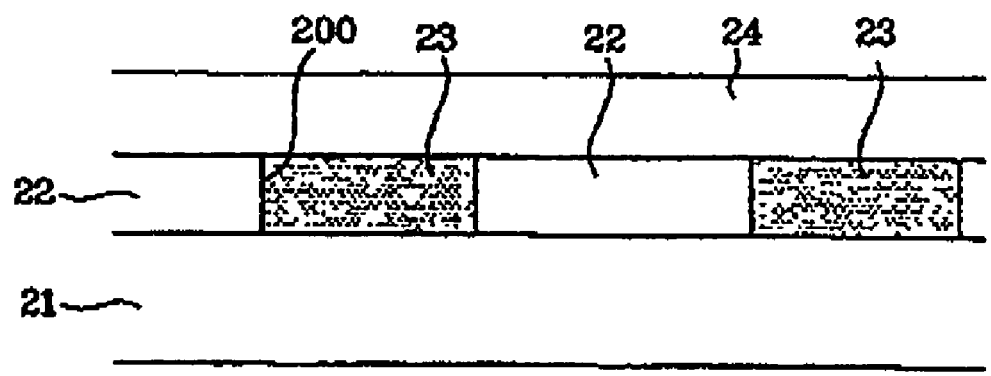
FIGS. 2A through 2H are partial sectional views depicting an example method for fabricating a semiconductor device.
Figure 2B:
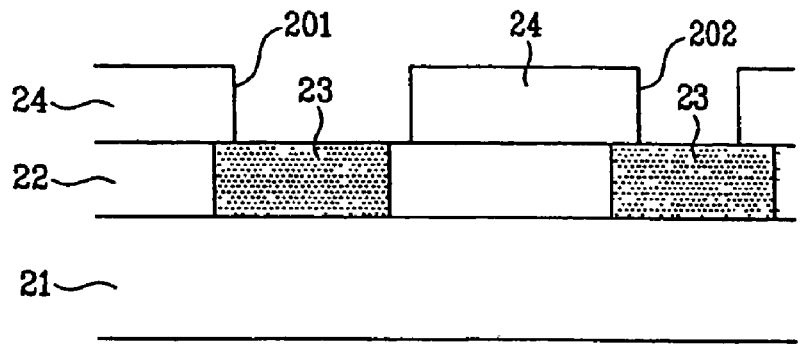
Figure 2C:
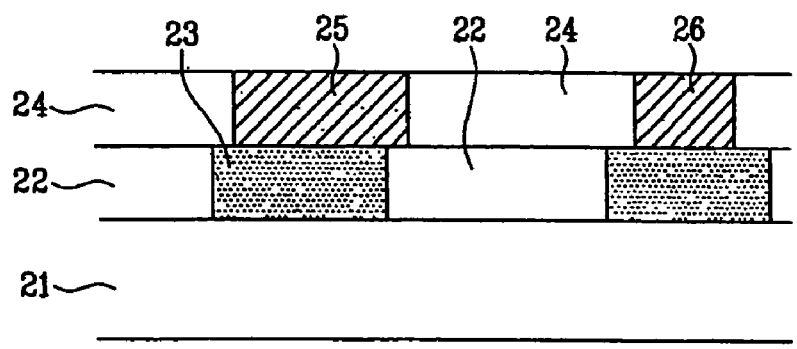
Figure 2D:
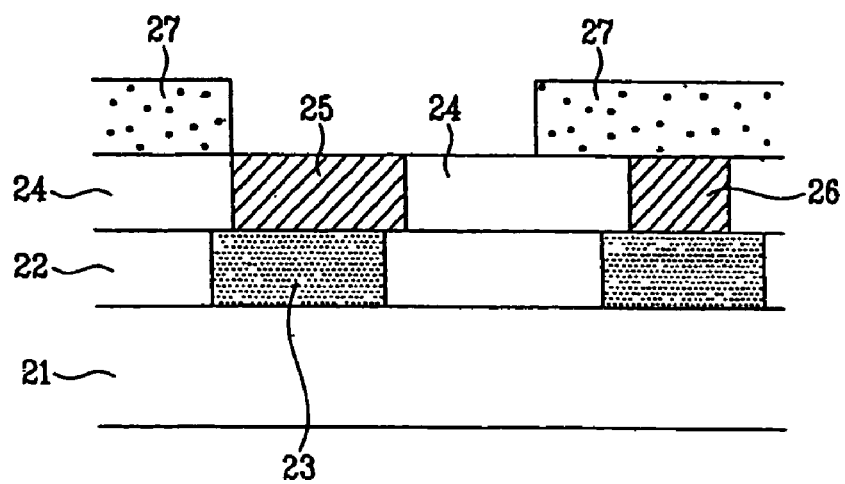
Figure 2E:
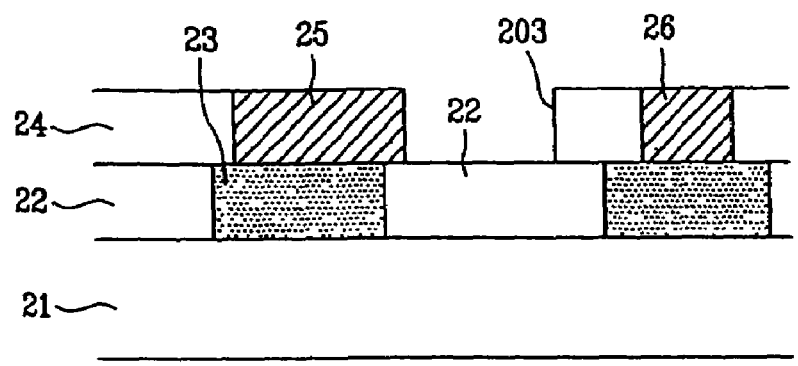
Figure 2F:
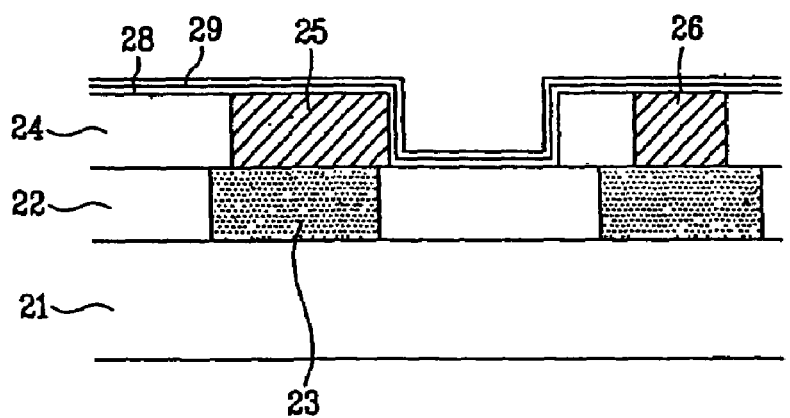
Figure 2G:
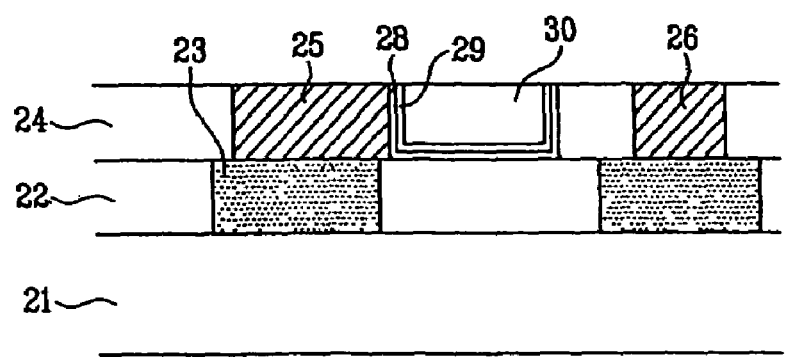
Figure 2H:
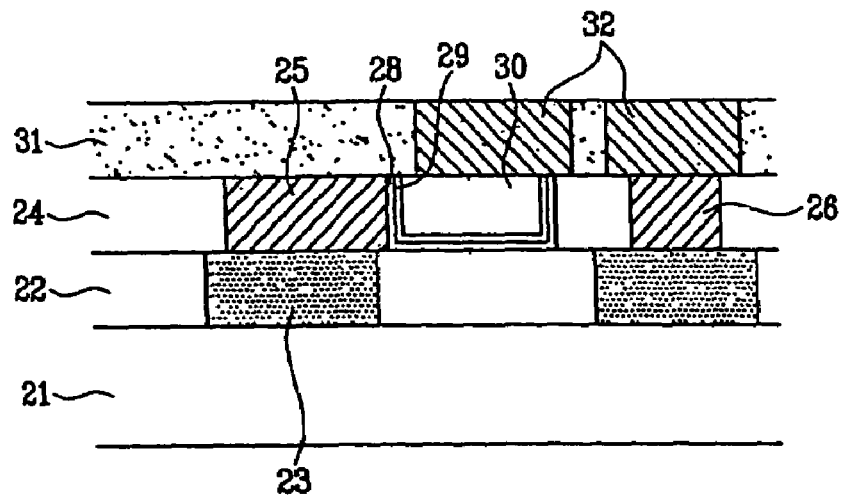
Figure 3A:
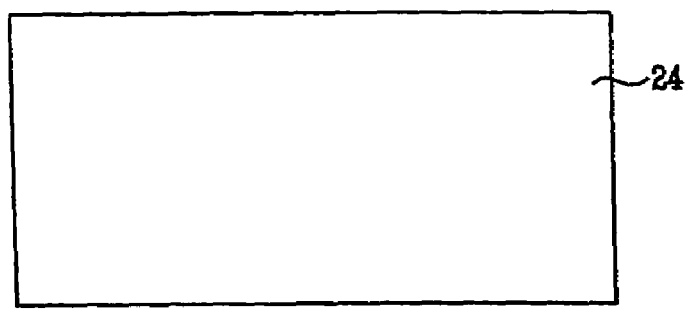
FIGS. 3A through 3H are plan views of structures shown in FIGS. 2A through 2H, respectively.
Figure 3B:
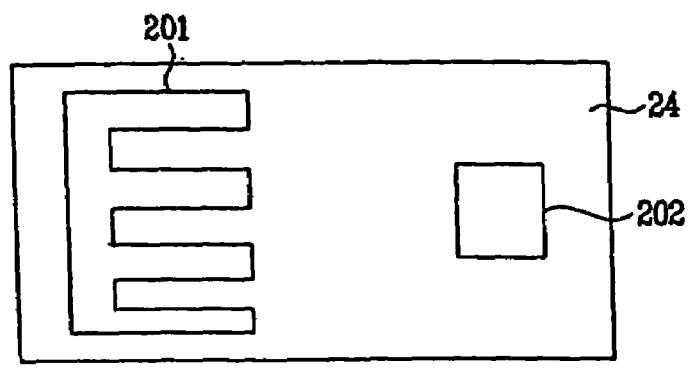
Figure 3C:
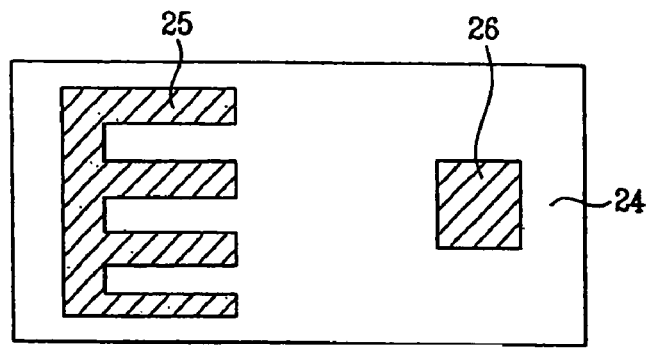
Figure 3D:
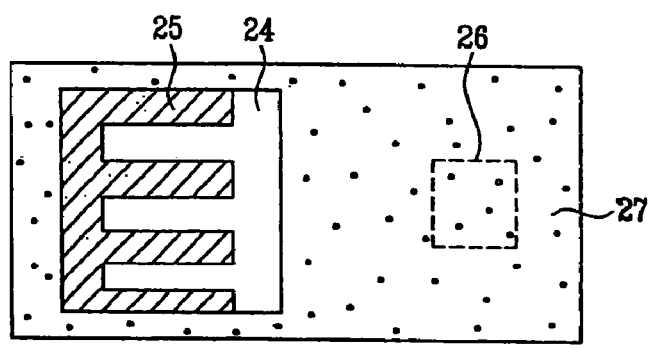
Figure 3E:
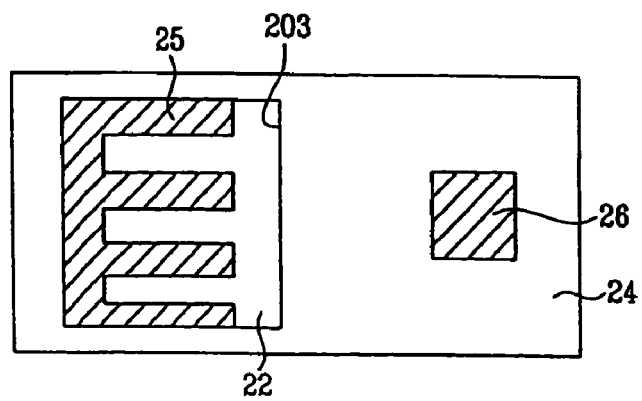
Figure 3F:
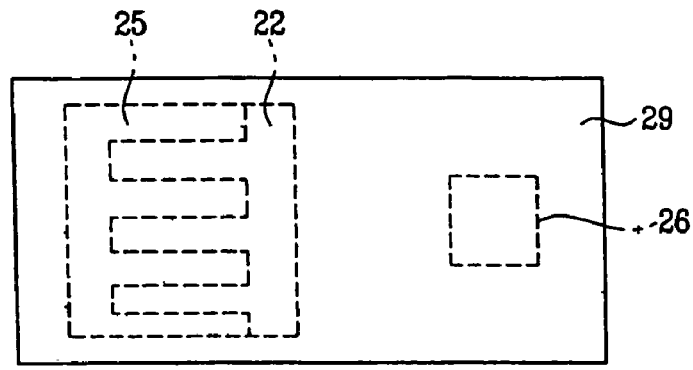
Figure 3G:
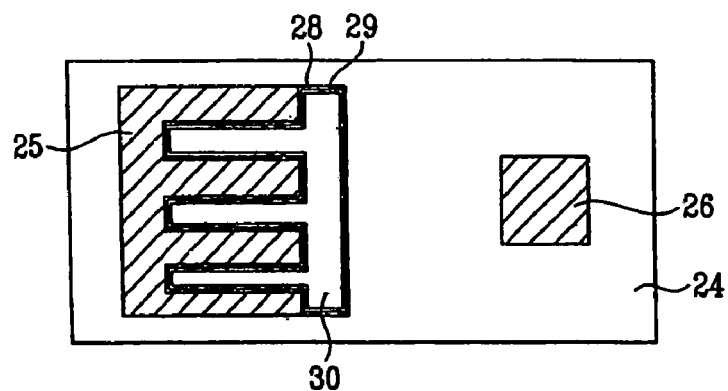
Figure 3H:
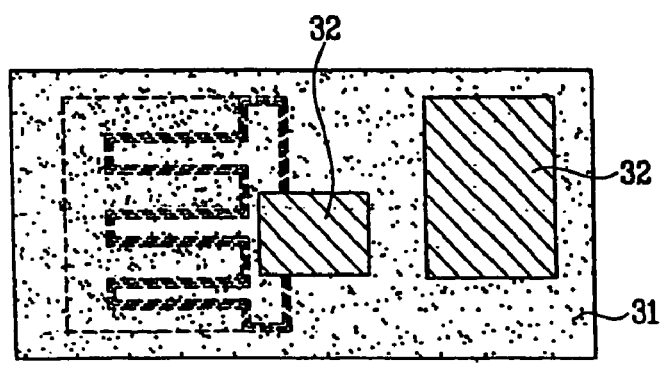

FIGS. 2A through 2H are partial sectional views depicting a method for fabricating a semiconductor, and FIGS. 3A through 3H are plan views showing structures shown in FIGS. 2A through 2H, respectively. A cross section and upper view of a completed semiconductor device fabricated according to the a preferred example are shown in FIGS. 2H and 3H, respectively.

With reference to the drawings, lower wiring 23 and a lower insulating film 22 are formed exposed on a structure 21 of a semiconductor substrate on which individual devices are formed. An interlayer insulating film 24 is formed on the lower insulating film 22. The interlayer insulating film 24 includes a first electrode opening 201, a via opening 202, and a second electrode opening 203 that expose the lower wiring 23.

A first electrode 25 fills the first electrode opening 201, dielectric layers 28 and 29 are formed over inner walls that define the second electrode opening 203, and a second electrode 30 is formed over the dielectric layers 28 and 29 filling the second electrode opening 203. The first electrode 25 and the second electrode 30 are preferably made of copper. Further, the first electrode opening 201 and the second electrode opening 203 are structures that include a plurality of branches that extend away from a base portion. As a result, the first electrode 25 corresponds to the shape of the first electrode opening 201, and the second electrode 30 and the dielectric layers 28 and 29 correspond to the shape of the second electrode opening 30.

Various materials may be used for the dielectric layers 28 and 29 depending on the desired device characteristics. For example, silicon oxide may be used for the dielectric layer 28, and silicon nitride may be used for the dielectric layer 29, with the silicon oxide and the silicon nitride being formed in this sequence to result in a layered configuration of the dielectric layers 28 and 29.

Upper wiring 32 is formed covering at least a portion of the second electrode 30, and an upper insulating film 31 is formed on the interlayer insulating film 24 and over all other elements such that an upper surface of the upper wiring 32 is left exposed. The upper wiring 32 and the lower wiring 23 may be made of copper.

A method of fabricating the semiconductor device described above will now be described in detail.

Referring first to FIGS. 2A and 3A, the structure 21 of a semiconductor substrate that includes individual devices formed using conventional semiconductor device processes is formed on the semiconductor substrate. Next, the lower insulating film 22 is formed on the semiconductor substrate structure 21, the lower insulating film 22 is selectively etched to form wiring openings 200, then copper is plated or sputtered all exposed elements. Chemical mechanical polishing is then performed until the lower insulating film 22 is exposed. The lower wiring 23 is formed by the copper that fills the wiring openings 200.

The lower wiring 23 need not necessarily be formed using copper, and it is possible to realize the lower wiring 23 using another metal. That is, a film made of a metal such as tungsten may be formed and patterned to realize the lower wiring 23 for the formation of a circuit of a semiconductor device.

Subsequently, the interlayer insulating film 24 is formed over the entire surface of the lower insulating film 22 and the lower wiring 23. The interlayer insulating film 24 is formed using a conventional plasma process and at a thickness of approximately 5000 Å.

Next, with reference to FIGS. 2B and 3B, the interlayer insulating film 24 is selectively etched to simultaneously form the first electrode opening 201 of the capacitor and the via opening 202. The first electrode opening 201 and the via opening 202 expose the lower wiring 23. The first electrode opening 201 of the capacitor may be formed to various shapes that make its surface area as large as possible. As an example, the first electrode opening 201 is formed as a structure that includes a plurality of branches that extend away from a base portion as shown in FIG. 3B.

Following the above processes, with reference to FIGS. 2C and 3C, copper is coated over all elements such that the first electrode opening 201 and the via opening 202 are filled to thereby form the first electrode 25 and a via 26. Chemical mechanical polishing is then performed until the interlayer insulating film 24 is exposed.

Next, with reference to FIGS. 2D and 3D, a photosensitive film is deposited, then exposed and developed to thereby form a photosensitive film pattern 27. The photosensitive film pattern 27 is formed such that it has an opening corresponding to the location of the first electrode 25. The opening of the photosensitive film pattern 27 is larger than the first electrode 25 such that the same is fully exposed, as is an area of the interlayer insulating film 24 adjacent to the first electrode 25 where the second electrode 30 (see FIGS. 2G and 3G) will be formed. The second electrode 30 of the capacitor is formed on the same layer as the first electrode 25 to be connected to the same in a horizontal configuration. The second electrode 30 is formed similarly to the first electrode 25 (i.e., similarly to the first electrode opening 201 into which the first electrode 25 is formed) having a plurality of branches that extend away from a base portion. The branches of the second electrode 30 are extended between the branches of the first electrode 25.

Next, with reference to FIGS. 2E and 3E, the photosensitive film pattern 27 is used as a mask to selectively etch the interlayer insulating film 24, thereby forming the second electrode opening 203 of the capacitor. The photosensitive film pattern 27 is then removed and a cleaning process is performed. During etching to form the second electrode opening 203, the etching select ratio of the interlayer insulating film 24 to the copper forming the first electrode 25 approaches infinity such that the first electrode 25 undergoes almost no change.

Referring now to FIGS. 2F and 3F, the dielectric layers 28 and 29 are thinly formed over all elements exposed following the processes described with reference to FIGS. 2E and 3E. Various materials may be used for the dielectric layers 28 and 29 depending on the desired device characteristics. In the example shown, silicon oxide is used for the dielectric layer 28, and silicon nitride is used for the dielectric layer 29, with the silicon oxide and the silicon nitride being formed in this sequence to result in a layered configuration of the dielectric layers 28 and 29. Preferably, each of the dielectric layers 28 and 29 is formed to a thickness of approximately 300 Å.

Subsequently, with reference to FIGS. 2G and 3G, copper is coated over all exposed elements such that the second electrode opening 203 is filled to thereby form the second electrode 30. Chemical mechanical polishing is then performed until the interlayer insulating film 24 is exposed. Since the dielectric layers 28 and 29 are formed along all inner wall surfaces of the second electrode opening 203, the contact area between the dielectric layers 28 and 29, and the first and second electrodes 25 and 30 is substantial (i.e., significantly increased over the prior art). The contact area may be further increased by adding more branches to the first and second electrode openings 201 and 203.

With the formation of the first and second openings 201 and 203 on the same layer, and the dielectric layers 28 and 29 formed along the inner walls of the second opening 203 again on the same layer, the capacitor is referred to as having a horizontal structure.

Finally, referring to FIGS. 2H and 3H, the upper insulating film 31 is formed over all exposed elements, after which the upper insulating film 31 is selectively etched to form a wiring opening connecting the second electrode 30 and the via 26. Copper is then coated over all elements such that the wiring hole is filled, and chemical mechanical polishing is performed until the upper insulating film 31 is exposed to thereby form the upper wiring 32. As with the lower wiring 23, the upper wiring 32 need not necessarily be formed using copper, and it is possible to realize the upper wiring 32 using another metal. That is, a film made of a metal such as tungsten may be formed and patterned to realize the upper wiring 32 for the formation of a circuit of a semiconductor device.

In the examples described above, the capacitor is formed in a horizontal configuration, the first and second electrodes are formed having a plurality of extending branches, and the dielectric layers are formed along the inner wall surfaces of the second electrode opening. As a result, the width of the upper wiring may be reduced over the conventional horizontal structure, thereby allowing an increase in the degree of integration of the upper wiring.

Further, in the example capacitor having the horizontal structure, because the first and second electrodes are formed with a plurality of extending branches as described above, the contact area between the dielectric layers and the first and second electrodes may be significantly increased compared to when using conventional configurations. This also allows a reduction in the width of the capacitor for the same contact area such that the degree of integration of the wiring may be increased.

In addition, with the formation of the dielectric layers over inner walls of the second electrode opening, the dielectric layers are safely left intact when etching the interlayer insulating film to form the via opening. This ensures that the thicknesses of the dielectric layers undergo almost no change, thereby stably maintaining the desired capacitance value and ultimately preventing malfunctioning of the device.

As set forth in the foregoing examples, a semiconductor device and a fabrication method thereof prevents malfunctioning of the device as a result of the problems encountered when utilizing capacitors having a vertical structure, namely, malfunctioning caused by limitations in the degree of integration of wiring and by variations in a thickness of a dielectric layer.

In addition, a first electrode, a dielectric layer, and a second electrode are formed on the same layer in a horizontal configuration. Further, the first and second electrodes are formed in a shape that increases their surface area. As an example, the first and second electrodes are each formed as structures including a plurality of branches that extend from a base portion, and the dielectric layer is formed along surfaces of the branches where the first and second electrodes make contact.

The example method for fabricating a semiconductor device includes forming an interlayer insulating film on a structure of a semiconductor substrate that exposes lower wiring and a lower insulating film; selectively etching the interlayer insulating film to form a first electrode opening that exposes the lower wiring; forming a first electrode in the first electrode opening such that the first electrode opening is filled; selectively etching the interlayer insulating film at a region of the same adjacent to the first electrode to thereby form a second electrode opening; forming a dielectric layer along inner walls that define the second electrode opening; forming a second electrode on the dielectric layer in such a manner to fill the second electrode opening; forming upper wiring on at least a portion of the second electrode.

Preferably, following the filling of the first electrode opening and the second electrode opening with the material used for the first and second electrodes, the first and second electrodes are formed by performing chemical mechanical polishing of a material used for the first and second electrodes until the interlayer insulating film is exposed. Also, it is preferable that the first and second electrodes are each formed in a structure having a plurality of branches extending from a base portion.

In addition, the dielectric layer is formed preferably by layering silicon oxide and silicon nitride.

Although example embodiments have been described in detail, it should be clearly understood that this patent covers all methods, apparatus and articles of manufacture fairly falling within the scope of the appended claims either literally or under the doctrine of equivalents.

What is claimed is:

1. A semiconductor device comprising:
   a substrate comprising a first wire;
   a first electrode of a capacitor on and in contact with an uppermost horizontal surface of the first wire;
   a second electrode of the capacitor on the substrate horizontally adjacent to the first electrode and having an uppermost horizontal surface that is coplanar with an uppermost horizontal surface of the first electrode;
   a dielectric layer between the first electrode and the second electrode to form a capacitance in a horizontal direction; and
   a second wire on and in contact with the uppermost horizontal surface of the second electrode.

2. The semiconductor device as claimed in claim 1, wherein each of the first and second electrodes has a top view in shape of a comb having a plurality of recess and concave patterns.

3. The semiconductor device as claimed in claim 2, wherein the recess patterns of the first electrode are formed face to face with the concave patterns of the second electrode, and the concave patterns of the first electrode are formed face to face with the recess patterns of the second electrode.

4. The semiconductor device as claimed in claim 2, wherein the first and second electrodes have walls facing each other, each wall having the plurality of recess and concave patterns.

5. The semiconductor device as claimed in claim 4, wherein the recess patterns of the first electrode are face to face with the concave patterns of the second electrode, and the concave patterns of the first electrode are face to face with the recess patterns of the second electrode.

6. The semiconductor device as claimed in claim 1, wherein the dielectric layer comprises a multi-layered structure having at least two layers.

7. The semiconductor device as claimed in claim 1, wherein the dielectric layer includes a silicon oxide layer and a nitride layer.

8. The semiconductor device as claimed in claim 1, wherein the dielectric layer is at opposite sides and a lower surface of the second electrode.

9. The semiconductor device as claimed in claim 1, wherein the first and second electrodes comprise copper.

10. The semiconductor device as claimed in claim 1, wherein the recess patterns of the first electrode are face to face with the concave patterns of the second electrode, and the concave patterns of the first electrode are face to face with the recess patterns of the second electrode.

11. The semiconductor device as claimed in claim 1, wherein the first electrode is on the lower wire and the lower insulating layer adjacent to the lower wire.

12. The semiconductor device as claimed in claim 1, wherein the first and second electrodes are on the same layer and comprise an identical material.

13. The semiconductor device as claimed in claim 1, wherein the capacitor comprises the first and second electrodes.

14. The semiconductor device of claim 1, wherein the lowermost horizontal surface of the second electrode is not coplanar with the lowermost horizontal surface of the first electrode.

* * * * *